United States Patent
Shao et al.

(10) Patent No.: US 10,229,901 B2
(45) Date of Patent: Mar. 12, 2019

(54) IMMERSION INTERCONNECTIONS FOR SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Tung-Liang Shao, Hsin-Chu (TW); Yi-Li Hsiao, Hsin-Chu (TW); Hsiao-Yun Chen, Hsin-Chu (TW); Chih-Hang Tung, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/194,170

(22) Filed: Jun. 27, 2016

(65) Prior Publication Data

US 2017/0373050 A1 Dec. 28, 2017

(51) Int. Cl.
*H01L 21/4763* (2006.01)
*H01L 23/48* (2006.01)
(Continued)

(52) U.S. Cl.
CPC ............ *H01L 25/50* (2013.01); *H01L 21/565* (2013.01); *H01L 21/78* (2013.01); *H01L 23/49827* (2013.01); *H01L 23/49838* (2013.01); *H01L 24/09* (2013.01); *H01L 24/11* (2013.01); *H01L 24/17* (2013.01); *H01L 24/81* (2013.01); *H01L 25/0655* (2013.01); *H01L 25/0657* (2013.01); *H01L 25/03* (2013.01);
(Continued)

(58) Field of Classification Search
CPC ......... H01L 25/50; H01L 24/81; H01L 24/09; H01L 24/17; H01L 24/11; H01L 25/0655; H01L 25/0657; H01L 21/565; H01L 23/49838; H01L 23/49827; H01L 21/78; H01L 2225/06513; H01L 2224/11464; H01L 2924/15311; H01L 2225/06548; H01L 2224/1316; H01L 2224/13173; H01L 2224/13116; H01L 2224/13111; H01L 2224/13139; H01L 2224/13157; H01L 2224/13144; H01L 2224/13164; H01L 2224/13155; H01L 2224/13147; H01L 2224/81007
USPC .................................. 438/650–651
See application file for complete search history.

(56) References Cited

U.S. PATENT DOCUMENTS 6,043,429 A * 3/2000 Blish, II ............. H01L 21/563
174/361
7,564,115 B2 7/2009 Chen et al.
(Continued)

*Primary Examiner* — Duy T Nguyen
*Assistant Examiner* — Dilinh Nguyen
(74) *Attorney, Agent, or Firm* — Slater Matsil, LLP

(57) ABSTRACT

Semiconductor devices and methods of manufacture thereof are disclosed. In some embodiments, a method of manufacturing a device includes coupling a first semiconductor device to a second semiconductor device by spacers. The first semiconductor device has first contact pads disposed thereon, and the second semiconductor device has second contact pads disposed thereon. The method includes forming an immersion interconnection between the first contact pads of the first semiconductor device and the second contact pads of the second semiconductor device.

20 Claims, 15 Drawing Sheets

(51) Int. Cl.
*H01L 23/52* (2006.01)
*H01L 25/00* (2006.01)
*H01L 21/56* (2006.01)
*H01L 21/78* (2006.01)
*H01L 23/498* (2006.01)
*H01L 23/00* (2006.01)
*H01L 25/065* (2006.01)
*H01L 25/03* (2006.01)

(52) U.S. Cl.
CPC ............. *H01L 2224/11464* (2013.01); *H01L 2224/1316* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/13173* (2013.01); *H01L 2224/81007* (2013.01); *H01L 2225/06513* (2013.01); *H01L 2225/06548* (2013.01); *H01L 2225/06568* (2013.01); *H01L 2225/06593* (2013.01); *H01L 2924/15311* (2013.01)

(56) References Cited

U.S. PATENT DOCUMENTS

| | | | |
|---|---|---|---|
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,361,842 B2 | 1/2013 | Yu et al. | |
| 8,426,961 B2* | 4/2013 | Shih | H01L 21/486 257/698 |
| 8,669,174 B2 | 3/2014 | Wu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,802,504 B1 | 8/2014 | Hou et al. | |
| 8,803,292 B2 | 8/2014 | Chen et al. | |
| 8,803,306 B1 | 8/2014 | Yu et al. | |
| 8,803,316 B2 | 8/2014 | Lin et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2006/0284298 A1* | 12/2006 | Kim | H01L 25/0657 257/686 |
| 2009/0224386 A1* | 9/2009 | Camacho | H01L 21/563 257/680 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0001645 A1 | 1/2014 | Lin et al. | |
| 2014/0203429 A1 | 7/2014 | Yu et al. | |
| 2014/0225222 A1 | 8/2014 | Yu et al. | |
| 2014/0225258 A1 | 8/2014 | Chiu et al. | |
| 2014/0252572 A1 | 9/2014 | Hou et al. | |
| 2014/0252646 A1 | 9/2014 | Hung et al. | |
| 2014/0264831 A1* | 9/2014 | Meyer | H01L 23/49816 257/737 |
| 2014/0264930 A1 | 9/2014 | Yu et al. | |
| 2015/0287697 A1 | 10/2015 | Tsai et al. | |
| 2015/0348872 A1 | 12/2015 | Kuo et al. | |
| 2016/0181190 A1* | 6/2016 | Fukasawa | H01L 21/563 257/774 |

\* cited by examiner

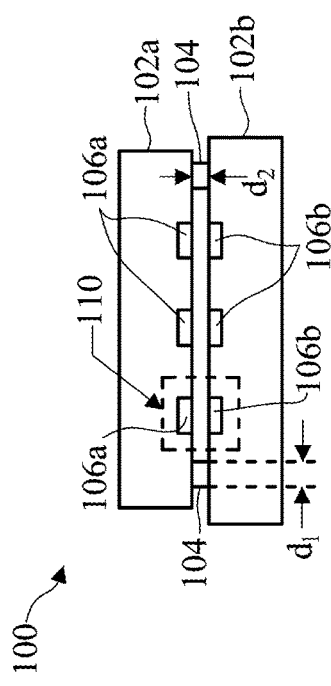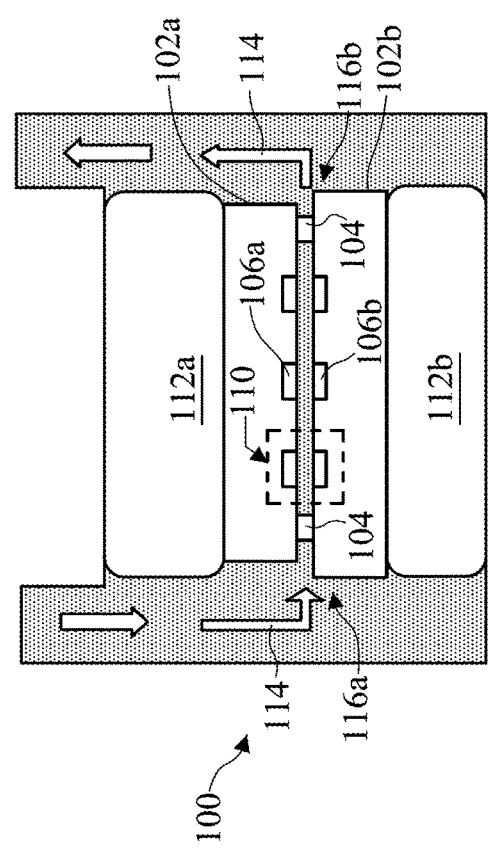

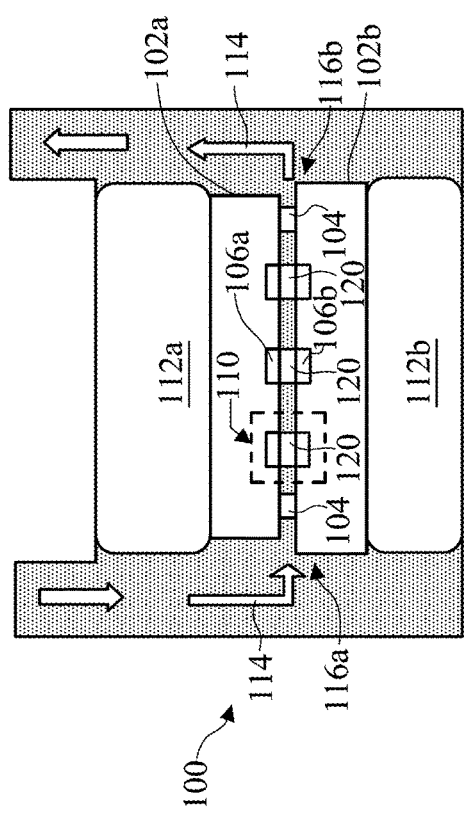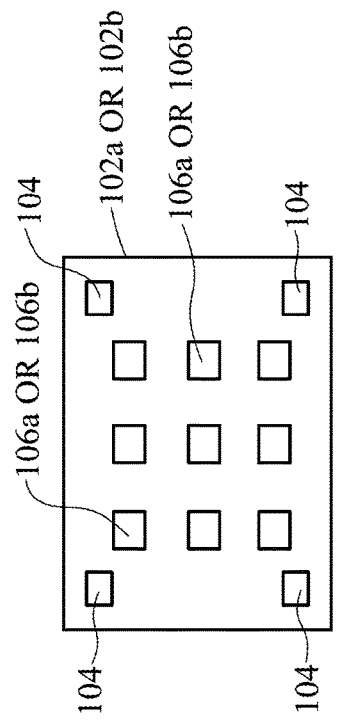

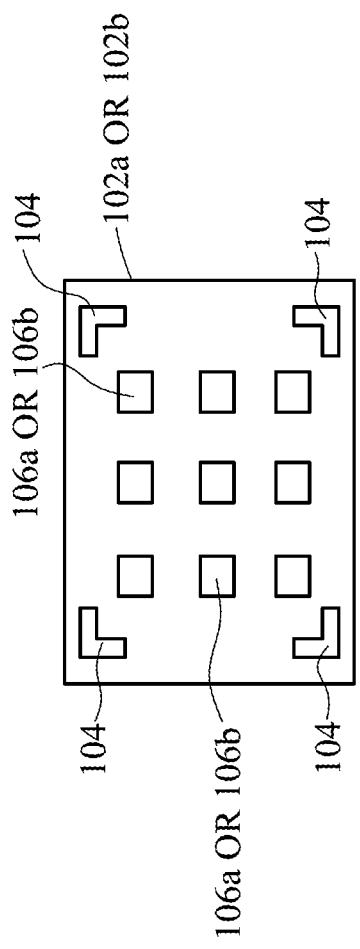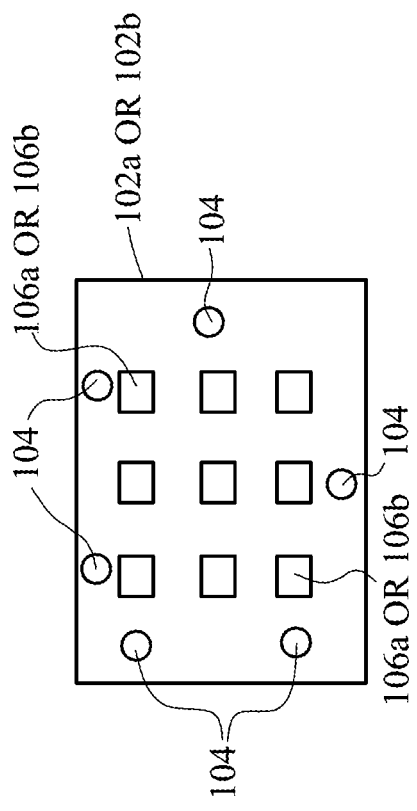

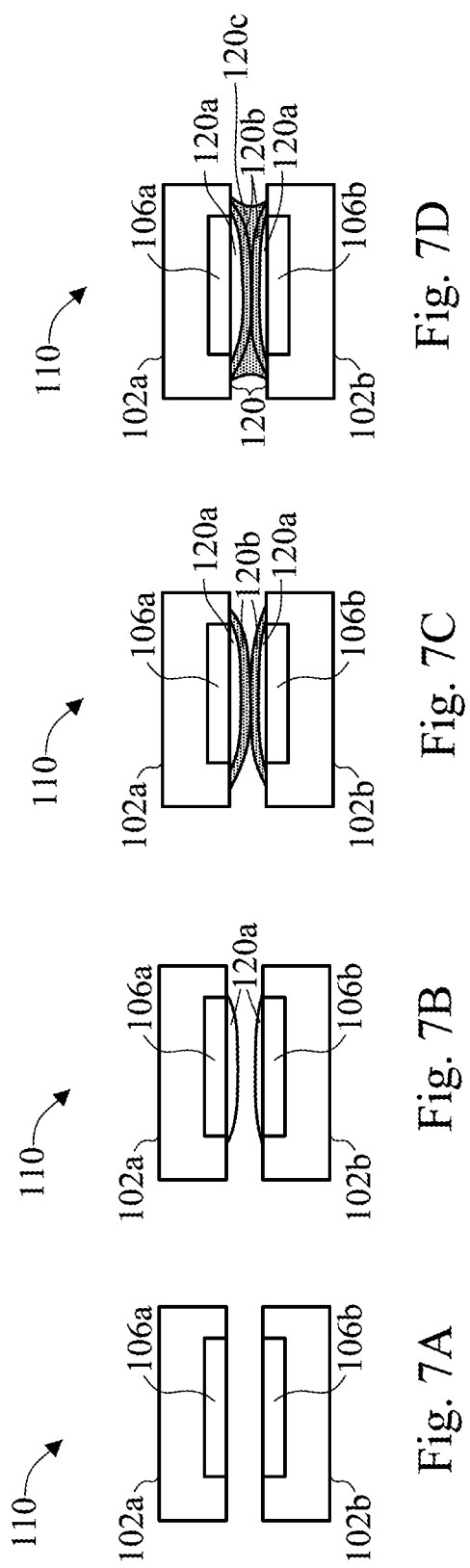

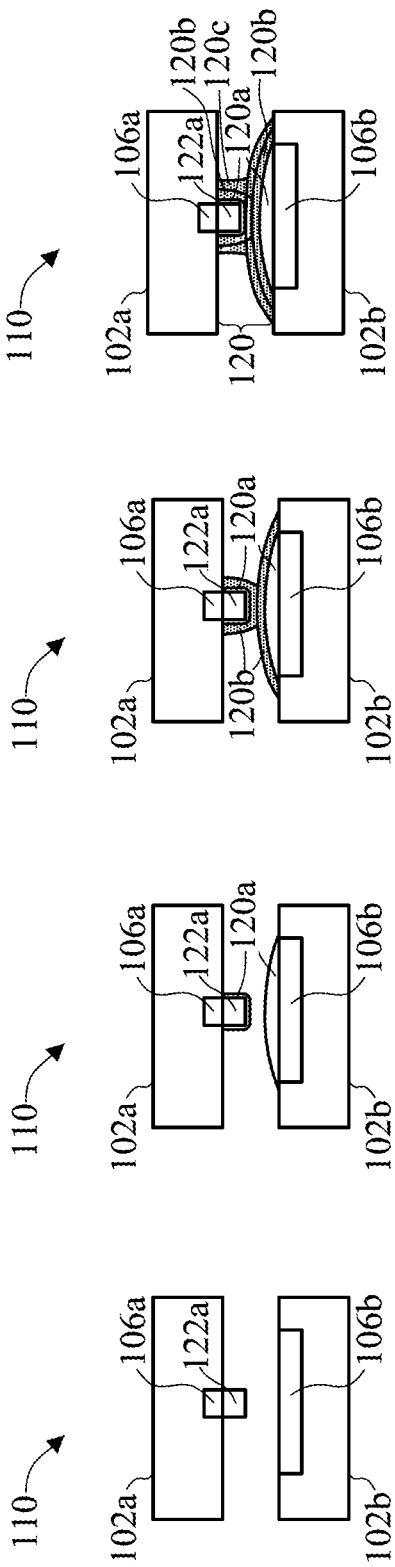

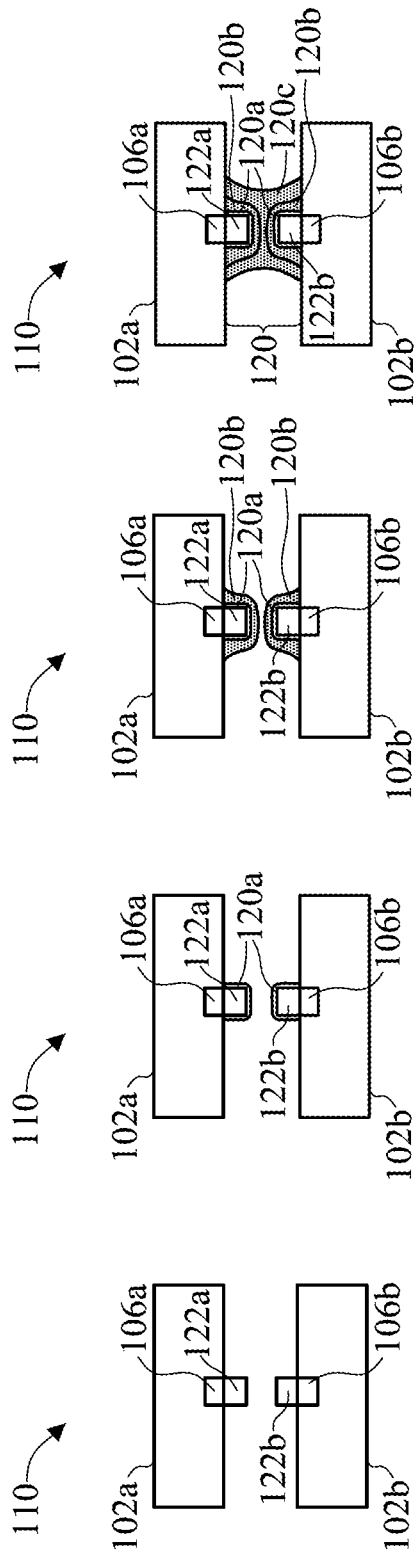

US 10,229,901 B2

IMMERSION INTERCONNECTIONS FOR SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allow more components to be integrated into a given area. As the demand for miniaturization, higher speed and greater bandwidth, as well as lower power consumption and latency has grown recently, there has grown a need for smaller and more creative packaging techniques for semiconductor dies.

As semiconductor technologies further advance, stacked semiconductor devices, e.g., three-dimensional integrated circuit (3DIC) devices, have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed or stacked on top of one another to further reduce the form factor of the semiconductor device.

Two semiconductor wafers and/or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a cross-sectional view that illustrates two semiconductor devices that are coupled together by a plurality of spacers in accordance with some embodiments of the present disclosure.

FIGS. 2 and 3 are cross-sectional views that show a method of forming immersion interconnections between contact pads of the two semiconductor devices shown in FIG. 1 in accordance with some embodiments.

FIGS. 4 through 6 are top or bottom views of portions of the semiconductor devices shown in FIGS. 1 through 3 that illustrate some exemplary shapes and placement of the plurality of spacers in accordance with some embodiments.

FIGS. 7A through 7D are cross-sectional views that illustrate an immersion process at various stages in accordance with some embodiments, wherein the immersion interconnection is made between contact pads of the two semiconductor devices.

FIGS. 8A through 8D illustrate cross-sectional views of an immersion process at various stages in accordance with some embodiments, wherein an immersion interconnection is made between a conductive pillar of a first semiconductor device and a contact pad of a second semiconductor device.

FIGS. 9A through 9D illustrate cross-sectional views of an immersion process at various stages in accordance with some embodiments, wherein an immersion interconnection is made between a conductive pillar of a first semiconductor device and a conductive pillar of a second semiconductor device.

DETAILED DESCRIPTION

Figure 10:
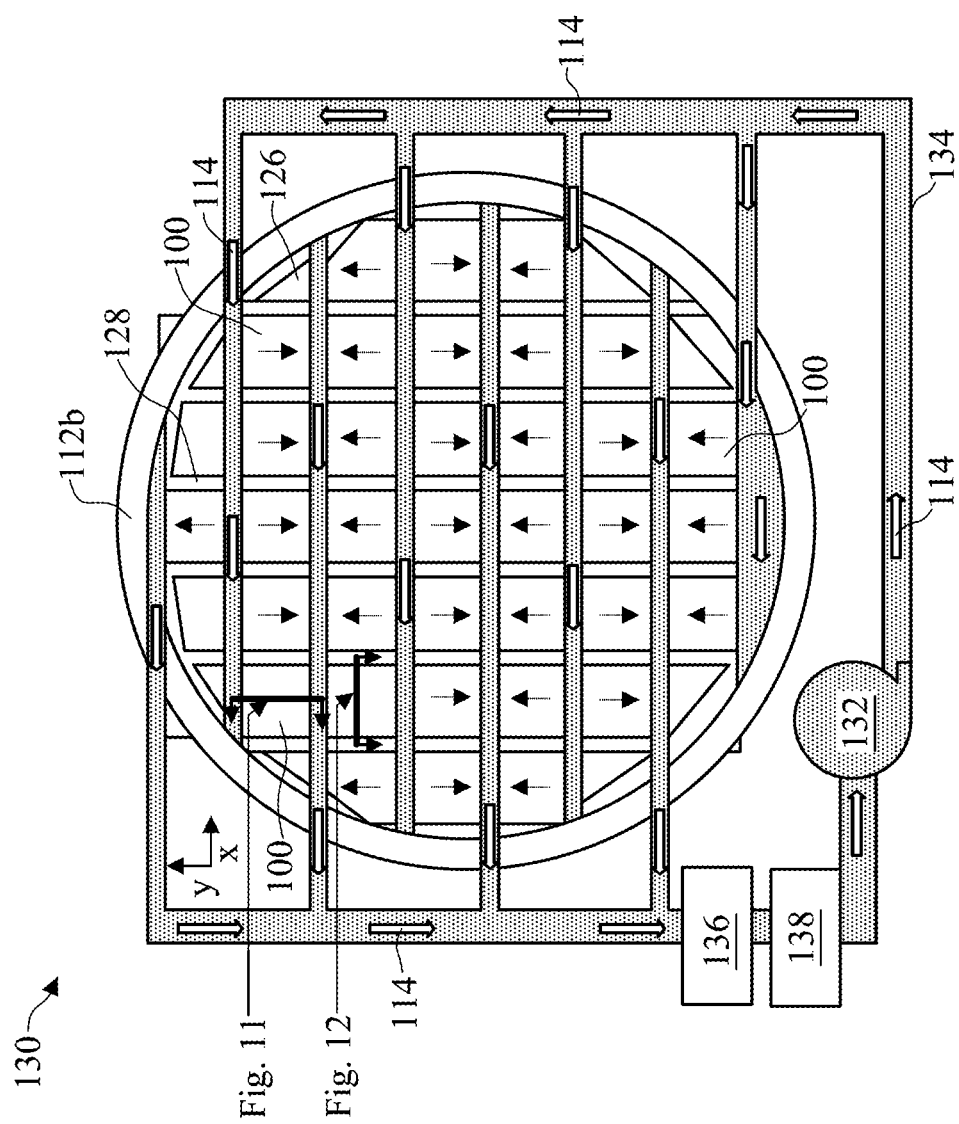
FIG. 10 is a top view of an electroless plating kit that illustrates a method of forming immersion interconnections for a plurality of semiconductor devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of manufacturing semiconductor devices and structures thereof are disclosed in the present disclosure. Semiconductor devices such as integrated circuit dies and/or semiconductor wafers are coupled together, forming 3DICs in some embodiments. Spacers are formed between two semiconductor devices, and an immersion interconnection is formed between contact pads and/or conductive pillars of the two semiconductor devices. The immersion interconnection formation process provides a simplified method and structure for forming connections between integrated circuit dies and/or wafers, may be performed at low temperatures and mechanical stress levels, provides a cycle time and cost savings, and enhances process windows of coplanarity and alignment, as examples. Throughout the various views and illustrative embodiments, like reference numerals are used to designate like elements.

FIG. 1 is a cross-sectional view that illustrates a first semiconductor device 102a that is coupled to a second semiconductor device 102b by a plurality of spacers 104 in accordance with some embodiments of the present disclosure. FIGS. 2 and 3 show cross-sectional views of immersion interconnections 120 being formed between contact pads 106a and 106b of the first semiconductor device 102a and the second semiconductor device 102b, respectively, shown in FIG. 1 in accordance with some embodiments.

Referring first to FIG. 1, a first semiconductor device 102a is provided. The first semiconductor device 102a comprises an integrated circuit die or a semiconductor wafer that includes a plurality of integrated circuit dies in some embodiments. A plurality of the first semiconductor devices 102a comprising integrated circuit dies that have been singulated from a wafer form may also be provided.

The first semiconductor device 102a may include a substrate in some embodiments. The substrate may comprise a silicon wafer, a silicon carbon substrate, a silicon germanium substrate, a substrate formed of other semiconductor materials, a bulk substrate, a silicon-on-wafer (SOI) substrate, or other supporting substrate (i.e., quartz, glass, etc., as are known in the art), or combinations thereof. The substrate may include one or more insulating materials disposed on a surface thereof. The insulating material may comprise one or more layers of $SiO_2$ or other insulating materials.

The substrate of the first semiconductor device 102a may include circuitry that comprises active device layer(s) formed over and/or within the substrate in a front-end-of-line (FEOL) stage of a manufacturing process or other type of process in some embodiments, for example. The circuitry may comprise any type of circuitry suitable for a particular application. The circuitry may comprise one or more electrical or electronic devices. For example, the circuitry may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions of the circuitry may include memory structures, logic structures, processing structures, sensors, amplifiers, power distribution or management, input/output circuitry, active or passive devices, radio frequency (RF) devices, analog or digital devices, and/or the like. One of ordinary skill in the art will appreciate that the above examples are provided for illustrative purposes to further explain applications of some illustrative embodiments and are not meant to limit the disclosure in any manner. The first semiconductor device 102a may also comprise other circuitry as appropriate for a given application.

An interconnect structure may formed over the substrate of the first semiconductor device 102a, e.g., over the circuitry. The interconnect structure may be formed in a back-end-of-line (BEOL) stage of a manufacturing process, for example. The interconnect structure may comprise a plurality of conductive features, a plurality of conductive lines, and/or a plurality of conductive vias disposed within a plurality of insulating material layers. The interconnect structure may comprise inter-layer dielectrics (ILD), inter-metallization dielectric (IMD) layers, or inter-metal layers, as examples. For example, the plurality of insulating material layers may be formed of a low-K dielectric material, such as phosphosilicate glass (PSG), borophosphosilicate glass (BPSG), fluorosilicate glass (FSG), $SiO_xC_y$, undoped silicate glass (USG), spin-on-glass, spin-on-polymers, silicon carbon material, compounds thereof, composites thereof, other materials, combinations or multiple layers thereof, or the like, formed using any suitable methods known in the art, such as spinning, chemical vapor deposition (CVD), or plasma-enhanced CVD (PECVD).

The plurality of conductive features, plurality of conductive lines, and/or plurality of conductive vias of the interconnect structure connect various circuitry such as passive and active components formed in and on the substrate to one another and to external components. The interconnect structure may include, for instance, one or more layers of conductive traces vertically interconnected by vias (not shown) embedded within dielectric layers that are formed using damascene processes or subtractive etch techniques. In some embodiments, an interconnect structure may not be included.

The first semiconductor device 102a comprises a plurality of contact pads 106a disposed thereon. A surface of the plurality of contact pads 106a may be coplanar with a surface of the first semiconductor device 102a, as illustrated in FIG. 1. The plurality of contact pads 106a may also be disposed over the surface of the first semiconductor device 102a, not shown. The plurality of contact pads 106a may be coupled to conductive features, conductive lines, and/or conductive vias within an interconnect structure of the first semiconductor device 102a in some embodiments. The plurality of contact pads 106a may also be coupled to circuitry of the substrate, directly or by the interconnect structure. The plurality of contact pads 106a may comprise Cu, Al, other metals or materials, or combinations, multiple layers, or alloys thereof, as examples. Three contact pads 106a are illustrated in FIGS. 1 through FIG. 3; however, the first semiconductor device 102a may comprise numerous contact pads 106a disposed on a surface thereof or formed within the substrate or interconnect structure. The plurality of contact pads 106a is also referred to herein as a plurality of first contact pads.

A second semiconductor device 102b is also provided. The second semiconductor device 102b comprises an integrated circuit die or a semiconductor wafer that includes a plurality of integrated circuit dies in some embodiments. A plurality of the second semiconductor devices 102b that comprise integrated circuit dies that have been singulated from wafer form may also be provided. The second semiconductor device 102b may include similar elements as described for the first semiconductor device 102a. For example, the second semiconductor device 102b may include a substrate, circuitry, and an interconnect structure. In some embodiments, the second semiconductor device 102b may comprise an interposer substrate that includes a plurality of through-vias 156 formed therein (not shown in FIG. 1; see FIGS. 16 and 17). The second semiconductor device 102b includes a plurality of contact pads 106b disposed thereon. The plurality of contact pads 106b of the second semiconductor device 102b is also referred to herein as a plurality of second contact pads.

The second semiconductor device 102b may be, but need not necessarily be, the same type of device as the first semiconductor device 102a, and the second semiconductor device 102b may be manufactured using similar processes and may include similar structures and materials as the first semiconductor device 102a. The second semiconductor device 102b may also comprise a different type of device than the first semiconductor device 102a, and the second semiconductor device 102b may be manufactured using different processes, structures, and materials than the first semiconductor device 102a.

The first semiconductor device 102a is inverted and is coupled to the second semiconductor device 102b by a plurality of spacers 104, as shown in FIG. 1. Contact pads 106a of the first semiconductor device 102a are aligned with contact pads 106b of the second semiconductor device 102b. The plurality of spacers 104 bond the first semiconductor device 102a to the second semiconductor device 102b, fixedly or temporarily in some embodiments. The plurality of spacers 104 may comprise a material such as polyimide, polyethylene terephthalate (PET), polymethylmethacrylate (PMMA), silicon, single-sided tape, double-sided tape, adhesive, glue, and/or combinations or multiple layers thereof, as examples. For example, the plurality of spacers 104 may comprise polyimide or PET double-sided tape with PMMA or silicon adhesive in some embodiments. In some embodiments, each of the plurality of spacers 104 comprises a width comprising dimension $d_1$, wherein dimension $d_1$ comprises about 50 μm to about 1,000 μm, for example. The plurality of spacers 104 comprises a thickness comprising dimension $d_2$ in some embodiments, wherein dimension $d_2$ comprises about 5 μm to about 100 μm, for example. Dimensions $d_1$ and $d_2$ of the plurality of spacers 104 comprise a size sufficient to create a space between the first and second semiconductor devices 102a and 102b for a solvent 114 (see FIG. 2) to flow to form immersion interconnections 120 (see FIG. 3) between contact pads 106a and 106b in some embodiments, for example. The plurality of spacers 104 may be attached by a bonder to the first semiconductor device 102a and/or the second semiconductor device 102b. The plurality of spacers 104 may also be formed by depositing a material over the first semiconductor device 102a and/or the second semiconductor device 102b, and patterning the material deposited on the first semiconductor device 102a and/or the second semiconductor device 102b to form the plurality of spacers 104. The material of the plurality of spacers 104 may also be applied by a spin-coating process or a lamination process in some embodiments, as other examples. The plurality of spacers 104 may also comprise other materials, dimensions, and formation or attachment methods.

The plurality of spacers 104 may be attached to or formed on either the first semiconductor device 102a or the second semiconductor device 102b in some embodiments, for example. A portion of the plurality of spacers 104 may also be attached to or formed on both the first semiconductor device 102a and the second semiconductor device 102b in some embodiments, as another example. The plurality of spacers 104 are disposed proximate edges or a perimeter of the first semiconductor device 102a or the second semiconductor device 102b in some embodiments, for example.

The first semiconductor device 102a is aligned with the second semiconductor device 102b so that each of the plurality of contact pads 106a of the first semiconductor device 102a is aligned with one of the plurality of contact pads 106b of the second semiconductor device 102b in some embodiments. The plurality of contact pads 106a of the first semiconductor device 102a and the plurality of contact pads 106b of the second semiconductor device 102b may comprise substantially the same pattern in some embodiments, for example. The first semiconductor device 102a and the second semiconductor device 102b may include alignment marks disposed thereon (not shown) to assist in alignment during the mounting and bonding process using the plurality of spacers 104.

The plurality of spacers 104 is spaced apart from the plurality of contact pads 106a and the plurality of contact pads 106b, e.g., in a horizontal direction, in some embodiments. For example, the plurality of spacers 104 are not positioned adjacent sides of the plurality of contact pads 106a and the plurality of contact pads 106b in some embodiments. The plurality of spacers 104 may be spaced apart from the plurality of contact pads 106a and the plurality of contact pads 106b to allow a flow of a solvent 114 (see FIG. 2) to pass through the spacers 104 and reach the plurality of contact pads 106a and the plurality of contact pads 106b so that immersion interconnections 120 may be made between the plurality of contact pads 106a and the plurality of contact pads 106b in some embodiments, for example. The plurality of spacers 104 also may be spaced apart from the plurality of contact pads 106a and the plurality of contact pads 106b by a sufficient amount such that a portion of the immersion interconnections 120 may extend laterally beyond the contact pads 106a and 106b proximate the edges of the 106a and 106b (see FIG. 7D).

Referring again to FIG. 1, the bonded first and second semiconductor devices 102a and 102b comprise a semiconductor device 100 that comprises a packaged semiconductor device or a 3DIC in some embodiments. For example, coupling the first semiconductor device 102a to the second semiconductor device 102b comprises forming a 3DIC device in some embodiments.

Region 110 comprises a region proximate one of the plurality of contact pads 106a and one of the plurality of contact pads 106b. A more detailed process flow for forming an immersion interconnection 120 between one of the plurality of contact pads 106a and one of the plurality of contact pads 106b in region 110 will be described further herein with reference to FIGS. 7A through 7D, FIGS. 8A through 8D, and FIGS. 9A through 9D.

Referring next to FIG. 2, after the first and second semiconductor devices 102a and 102b are aligned, stacked, and bonded together using the plurality of spacers 104 as shown in FIG. 1, vertical electrical connections between the first and second semiconductor devices 102a and 102b are formed. The vertical electrical connections are formed using an immersion process in some embodiments. The immersion process comprises an electroless plating process in some embodiments, for example.

The second semiconductor device 102b is mounted to a support 112b, and a support 112a is placed over the first semiconductor device 102a, as illustrated in FIG. 2. The supports 112a and 112b may comprise trays, plates, frames, or other types of supporting devices or structures. The supports 112a and 112b may comprise a part of an electroless plating kit (see electroless plating kits 130 shown in FIGS. 10 and 13) in some embodiments, for example.

Referring again to FIG. 2, a solvent 114 is flowed from one side 116a of the semiconductor device 100 to an opposite side 116b of the semiconductor device 100. The solvent 114 is flowed into a gap between the first semiconductor device 102a and the second semiconductor device 102b through the plurality of spacers 104 and between the plurality of contact pads 106a and the plurality of contact pads 106b. The semiconductor device 100 may be immersed in the solvent 114 in some embodiments, for example. The solvent 114 comprises a material that is adapted to be electrolessly plated onto the plurality of contact pads 106a and the plurality of contact pads 106b in some embodiments. The solvent 114 comprises an electroless plating solvent in some embodiments. For example, the solvent 114 may comprise Cu, Ni, Pd, Au, Co, Ag, Sn, Pb, Rh, Fe, and/or combinations thereof in some embodiments. The solvent 114 may also include other components, such as one or more suppressors, levelers, accelerators, and/or other additives.

The flow of the solvent 114 is continued for a predetermined period of time that is sufficient to form an immersion interconnection 120 between each of the plurality of contact pads 106a and one of the plurality of contact pads 106b, as shown in FIG. 3. The amount of time duration for the flow of the solvent 114 may vary depending on the type of material that the immersion interconnection 120 comprises and other factors such as the size of the immersion interconnection 120 desired, for example. A data sheet of plating rates by material type, such Cu, Ni, Pd, Au, Co, Ag, Sn, Pb, Rh, and/or Fe may be established, and based on the plating rate by material type, an estimation of the plating time needed to form immersion interconnections 120 of a desired size may be determined, for example. The time duration for the flow of the solvent 114 may also be determined using other methods.

When a time duration determined for forming the immersion interconnections 120 has passed, the flow of the solvent 114 is ceased, and the semiconductor device 100 is removed from the supports 112b and 112a. In some embodiments wherein the second semiconductor device 102b comprises a wafer, the wafer is singulated, and the manufacturing process for the semiconductor devices 100 has been completed. A packaging process for the semiconductor devices 100 may also be performed or continued, which will be described further herein. Likewise, in some embodiments wherein the first semiconductor device 102a comprises a wafer, the wafer is singulated, and the manufacturing process for the semiconductor devices 100 has been completed. A packaging process for the semiconductor devices 100 may also be performed or continued. Similarly, in some embodiments wherein the first semiconductor device 102a and the second semiconductor device 102b both comprise integrated circuit dies, the manufacturing process for the semiconductor device 100 has been completed, or a packaging process for the semiconductor devices 100 may also be performed or continued. In some embodiments, a plurality of first semiconductor devices 102a and a plurality of second semiconductor devices 102b bonded by the plurality of spacers 104 may be placed on a support 112b, and immersion interconnections 120 may be formed, as another example.

The plurality of spacers 104 may be left remaining on the semiconductor devices 100 after the immersion interconnections 120 are formed in accordance with some embodiments. In some embodiments, the plurality of spacers 104 may be removed after the immersion interconnections 120 are formed. For example, in some embodiments wherein the plurality of spacers 104 comprises a material that may be removed using an etching process, cleaning process, and/or other type of process, the plurality of spacers 104 may be removed before the semiconductor device 100 is used in an end application or is further packaged (see FIGS. 16 through 19 wherein the plurality of spacers 104 is not shown to be included in packaged semiconductor devices 150 and 170). The plurality of spacers 104 may also be removed using other methods.

The immersion interconnections 120 shown in FIG. 3 may comprise Cu, Ni, Pd, Au, Co, Ag, Sn, Pb, Rh, Fe, or combinations thereof in some embodiments. The immersion interconnections 120 formed between the plurality of contact pads 106a and 106b of the first and second semiconductor devices 102a and 102b, respectively, may comprise a solderless material in some embodiments. For example, the immersion interconnections 120 formed between the plurality of contact pads 106a and 106b of the first and second semiconductor devices 102a and 102b may not comprise an alloy, but rather, may comprise a material comprising a single element in some embodiments. The immersion interconnections 120 comprising a material comprising a single element may comprise Cu, Ni, Pd, Au, Co, Ag, Sn, Pb, Rh, or Fe, in some embodiments, as examples. The immersion interconnections 120 may also comprise other materials.

FIGS. 4, 5, and 6 are top or bottom views of portions of the semiconductor device 100 shown in FIGS. 1 through 3 in accordance with some embodiments, which illustrate some exemplary shapes and positions of the plurality of spacers 104 and other elements of the semiconductor device 100. The plurality of contact pads 106a or 106b may be arranged in an array. For example, a three by three array of the plurality of contact pads 106a or 106b is illustrated in FIGS. 4, 5, and 6. The plurality of contact pads 106a or 106b may also be arranged in other shapes. In FIG. 4, the plurality of spacers 104 is placed in the corners of the first or second semiconductor device 102a or 102b, and the plurality of spacers 104 comprise substantially rectangular shapes. The plurality of spacers 104 may also comprise other shapes, such as oval, square, circular, L-shaped, or other shapes, and the plurality of spacers 104 may be placed in other locations on the first or second semiconductor device 102a or 102b. In FIG. 5, the plurality of spacers 104 comprises L-shapes and is placed in the corners of the first or second semiconductor device 102a or 102b. In FIG. 6, the plurality of spacers 104 comprises circular shapes and is placed in various locations in a perimeter and edge regions of the first or second semiconductor device 102a or 102b. In some embodiments, the plurality of spacers 104 is spaced apart from one another by a sufficient amount of space so that the solvent 114 (see FIGS. 2 and 3) may flow between the plurality of spacers 104 and reach the plurality of contact pads 106a and 106b.

FIGS. 7A through 7D, 8A through 8D, and 9A through 9D illustrate a more detailed view of an immersion process for region 110 of FIGS. 1 through 3 in accordance with some embodiments. FIGS. 7A through 7D illustrate cross-sectional views of an immersion process at various stages in accordance with some embodiments, wherein the immersion interconnection 120 is made between contact pads 106a and 106b of the first semiconductor device 102a and the second semiconductor device 102b, respectively. FIG. 7A illustrates the contact pads 106a and 106b before the flow of the solvent 114 (see FIGS. 2 and 3) is started, wherein the contact pads 106a and 106b are substantially aligned and are spaced apart by an amount that is substantially the same as the thickness comprising dimension $d_2$ of the plurality of spacers 104 (see FIG. 1). FIG. 7B shows the formation of first portions 120a of the immersion interconnection 120 after the flow of the solvent 114 has begun. The first portions 120a of the immersion interconnection 120 are formed over surfaces of the contact pads 106a and 106b and may comprise a dome shape. As the flow of the solvent 114 is continued, second portions 120b of the immersion interconnection 120 are formed over the first portions 120a over the contact pads 106a and 106b, as shown in FIG. 7C. The second portions 120b have connected to one another in the immersion process stage shown in FIG. 7C, for example. As the flow of the solvent 114 is continued, a third portion 120c of the immersion interconnection 120 is formed over the second portions 120b disposed over the contact pads 106a and 106b, as shown in FIG. 7D. The third portion 120c may extend and enlarge the immersion interconnection 120 laterally, for example. The immersion interconnection 120 includes the first portions 120a, the second portions 120b, and the third portion 120c that are disposed between the contact pads 106a and 106b of the first and second semiconductor devices 102a and 102b, respectively.

In some embodiments, the plurality of contact pads 106a and/or the plurality of contact pads 106b each comprise a conductive pillar 122a/122b (see FIGS. 8A through 9D) coupled thereto, and forming the immersion interconnection 120 further comprises forming the immersion interconnection 120 around and/or over the conductive pillar(s) 122a/122b. The conductive pillars 122a/122b are coupled to the contact pads 106a and/or 106b and may comprise copper, a copper alloy, or other conductive materials, as examples. The conductive pillars 122a/122b may be formed using a plating process or a deposition process, as examples. The conductive pillars 122a/122b may also be formed using other methods.

For example, in FIGS. 8A through 8D, the contact pad 106a of the first semiconductor device 102a includes a conductive pillar 122a coupled thereto. FIGS. 8A through 8D illustrate cross-sectional views of an immersion process at various stages in accordance with some embodiments, wherein the immersion interconnection 120 is made between a conductive pillar 122a coupled to a contact pad 106a of the first semiconductor device 102a and a contact pad 106b of the second semiconductor device 102b. In FIG. 8A, after the first semiconductor device 102a is coupled to the second semiconductor device 102b by the plurality of spacers 104, the conductive pillar 122a is spaced apart from the contact pad 106b by an amount that is substantially the same as the thickness comprising dimension $d_2$ of the plurality of spacers 104 less the thickness of the conductive pillar 122a. FIG. 8B shows the formation of first portions 120a of the immersion interconnection 120 after the flow of the solvent 114 has begun. The first portions 120a of the immersion interconnection 120 are formed over surfaces of the conductive pillar 122a and the contact pad 106b and may comprise a dome shape over the contact pad 106b. As the flow of the solvent 114 is continued, second portions 120b of the immersion interconnection 120 are formed over the first portions 120a over the conductive pillar 122a and the contact pad 106b, as shown in FIG. 8C. The second portions 120b have connected to one another in the immersion process stage shown in FIG. 8C, for example. As the flow of the solvent 114 is continued, a third portion 120c of the immersion interconnection 120 is formed over the second portions 120b disposed over the conductive pillar 122a and the contact pad 106b, as shown in FIG. 8D. The third portion 120c may extend and enlarge the immersion interconnection 120 laterally, for example. The immersion interconnection 120 includes the first portions 120a, the second portions 120b, and the third portion 120c that are disposed between and around the conductive pillar 122a coupled to the contact pad 106a and between the contact pad 106b of the first and second semiconductor devices 102a and 102b, respectively.

FIGS. 9A through 9D illustrate cross-sectional views of an immersion process at various stages in accordance with some embodiments, wherein an immersion interconnection 120 is made between a conductive pillar 122a coupled to a contact pad 106a of the first semiconductor device 102a and a conductive pillar 122b coupled to a contact pad 106b of the second semiconductor device 102b. In FIG. 9A, after the first semiconductor device 102a is coupled to the second semiconductor device 102b by the plurality of spacers 104, the conductive pillar 122a is spaced apart from the conductive pillar 122b by an amount that is substantially the same as the thickness comprising dimension $d_2$ of the plurality of spacers 104 less the thickness of the conductive pillars 122a and 122b. FIG. 9B shows the formation of first portions 120a of the immersion interconnection 120 after the flow of the solvent 114 has begun. The first portions 120a of the immersion interconnection 120 are formed over surfaces of the conductive pillars 122a and 122b. As the flow of the solvent 114 is continued, second portions 120b of the immersion interconnection 120 are formed over the first portions 120a over the conductive pillars 122a and 122b, as shown in FIG. 9C. The second portions 120b have not yet connected to one another in the immersion process stage shown in FIG. 9C, for example. As the flow of the solvent 114 is continued, a third portion 120c of the immersion interconnection 120 is formed over the second portions 120b disposed over the conductive pillars 122a and 122b, as shown in FIG. 9D. The third portion 120c connects together the second portions 120b, for example. The third portion 120c may also extend and enlarge the immersion interconnection 120 laterally, for example. The immersion interconnection 120 includes the first portions 120a, the second portions 120b, and the third portion 120c that are disposed between the conductive pillars 122a and 122b coupled to the contact pads 106a and 106b of the first and second semiconductor devices 102a and 102b, respectively. A portion of the immersion interconnection 120 is disposed around the conductive pillars 122a and 122b.

Thus, in some embodiments, the plurality of first contact pads 106a or the plurality of second contact pads 106b may comprise a conductive pillar 122a or 122b coupled thereto, and forming the immersion interconnection 120 may further comprise forming the immersion interconnection 120 around the conductive pillars 122a or 122b.

Note that the contact pad 106b of the second semiconductor device 102b may have a conductive pillar 122b disposed thereon, and the contact pad 106a of the first semiconductor device 102a may not have a conductive pillar disposed thereon, in some embodiments. Note also that in some of the embodiments shown in FIGS. 8A through 8D and FIGS. 9A through 9D, the plurality of spacers 104 may comprise a thickness comprising dimension $d_2$ such that the conductive pillar 122a is initially in contact with the contact pad 106b in the immersion process stage shown in FIG. 8A, or the conductive pillar 122a is initially in contact with the conductive pillar 122b in the immersion process stage shown in FIG. 9A.

The flow of the solvent 114 advantageously may comprise a relatively low temperature process, i.e., at about 80 degrees C. or less. The immersion interconnections 120 comprise electrical connections or joints that are formed without high bonding forces or high thermal mechanical forces, for example. Thus, semiconductor device 100 yields are improved. Furthermore, the flow of the solvent 114 used to form the immersion interconnections 120 comprises a selective deposition process, so that contact pads 106a and 106b and/or conductive pillars 122a or 122b that may be slightly mis-aligned will be connected with the immersion interconnections 120 formed.

FIG. 10 is a top view of an electroless plating kit 130 that illustrates a method of forming immersion interconnections 120 for a plurality of semiconductor devices 100. An electroless plating kit 130 comprising a chip-on-wafer (CoW) type flow design kit is illustrated, wherein second semiconductor devices 102b are in wafer 126 form and a plurality of first semiconductor devices 102a in singulated integrated circuit die form are coupled to the second semiconductor devices 102b in wafer 126 form. After the immersion interconnections 120 are formed, the second semiconductor device 102b in wafer 126 form may be singulated along scribe lines 128, for example. The wafer 126 may comprise a semiconductor wafer, and interposer substrate wafer, or an integrated fan-out (InFO) wafer in some embodiments, as examples.

The second semiconductor device 102b in wafer 126 form with the mounted first semiconductor devices 102a disposed thereon is placed in the electroless plating kit 130. The solvent 114 is flowed using a pump 132 through a delivery means 134 to the semiconductor devices 100 which may comprise one or more pipes, tubes, lines, or channels, as examples. The solvent 114 flows across the wafer 126 in the gap between the first semiconductor device 102a and the second semiconductor device 102b of the semiconductor devices 100. The solvent 114 flows from the right side to the left side of the electroless plating kit 130 in some of the embodiments shown in FIG. 10. The solvent 114 is then passed through a debubbler 136 and a particle filter 138 in some embodiments, and back to the pump 132. The solvent 114 is continued to be flowed across the wafer 126 in the gap between the first semiconductor device 102a and the second semiconductor device 102b of the semiconductor devices 100 until the formation of the immersion interconnections 120 is completed. The second semiconductor device 102b in wafer 126 form with the mounted first semiconductor devices 102a disposed thereon is then removed from the electroless plating kit 130.

Figure 11:
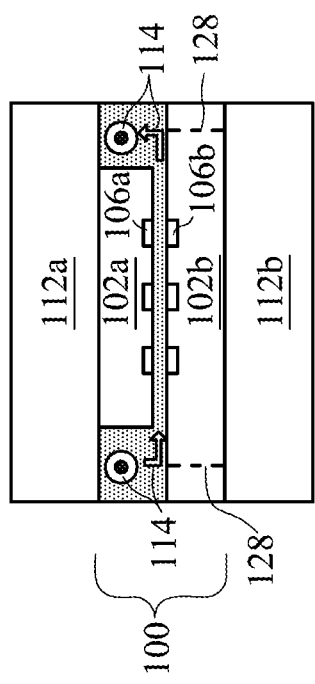
FIGS. 11 and 12 are cross-sectional views of portions of the electroless plating kit shown in FIG. 10 that illustrate a flow of a solvent in an electroless plating process in accordance with some embodiments.
Figure 12:
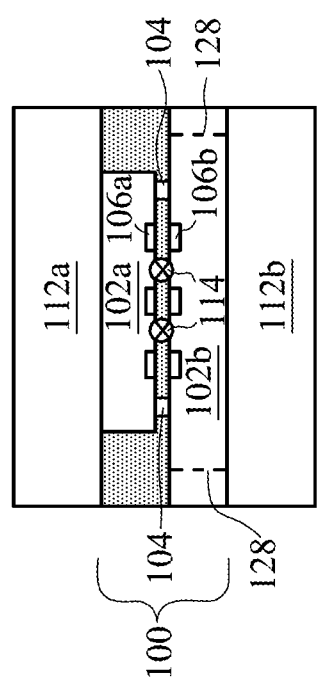

FIGS. 11 and 12 are cross-sectional views of portions of the electroless plating kit shown in FIG. 10 that illustrate the flow of the solvent 114 in an electroless plating process or immersion process shown in FIG. 10. The flow of the solvent 114 between the first semiconductor device 102a and the second semiconductor device 102b along an x axis in the view shown in FIG. 10 is shown in FIG. 11. The flow of the solvent 114 between the first semiconductor device 102a and the second semiconductor device 102b along a y axis in the view shown in FIG. 10 is shown in FIG. 12.

Figure 13:
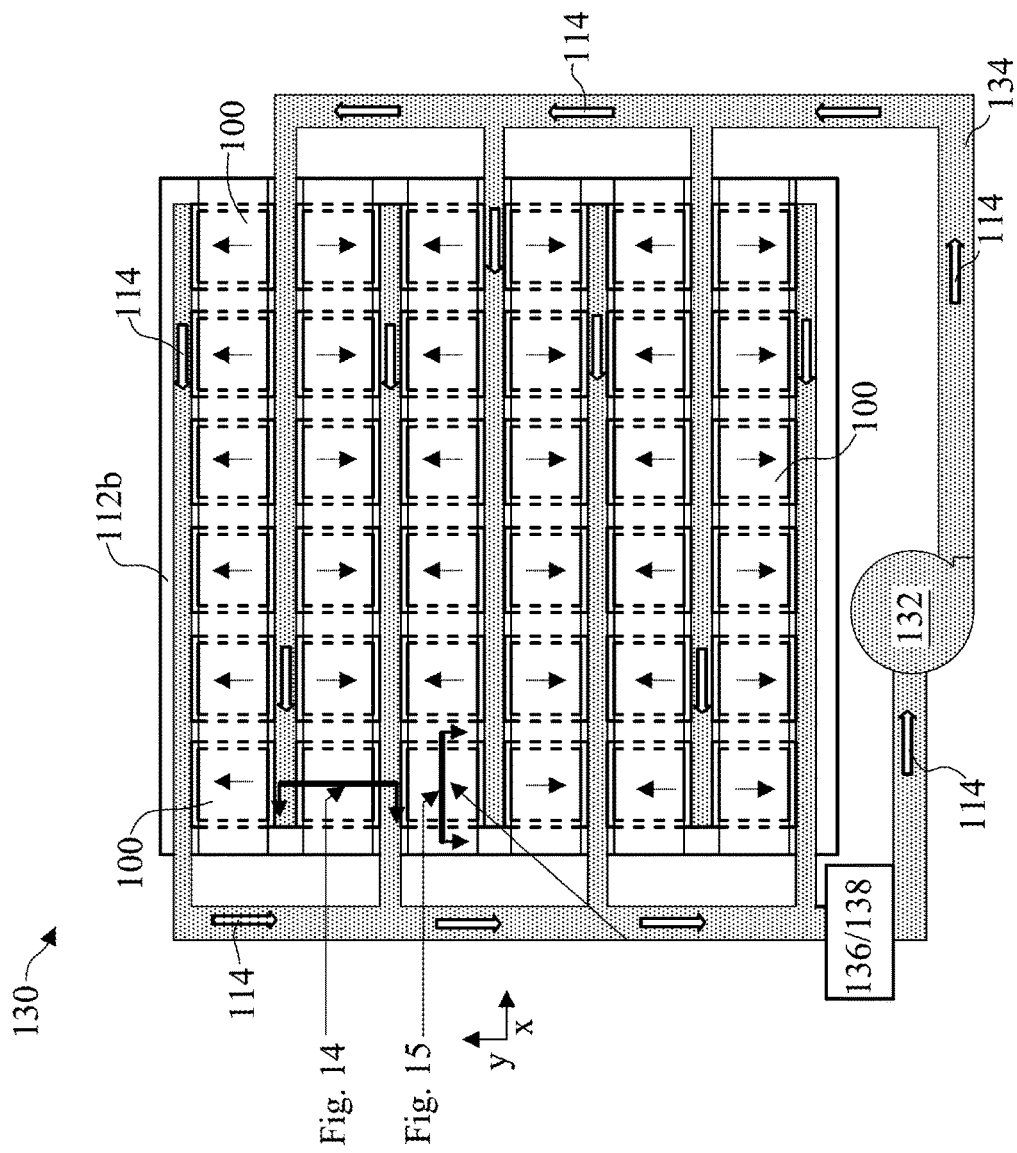
FIG. 13 is a top view of an electroless plating kit that illustrates a method of forming immersion interconnections for a plurality of semiconductor devices in accordance with some embodiments.

FIG. 13 is a top view of an electroless plating kit 130 that illustrates a method of forming immersion interconnections 120 for a plurality of semiconductor devices 100. An electroless plating kit 130 comprising a chip-on-chip (CoC) type flow design kit is illustrated, wherein the second semiconductor devices 102b and the first semiconductor devices 102a are both in singulated integrated circuit die form are bonded together by the plurality of spacers 104 and mounted onto the electroless plating kit 130. The solvent 114 is flowed across the semiconductor devices 100 in the gaps between the first semiconductor devices 102a and the second semiconductor devices 102b of the plurality of semiconductor devices 100 until the formation of the immersion interconnections 120 is completed. The plurality of semiconductor devices 100 is then removed from the electroless plating kit 130.

Figure 14:
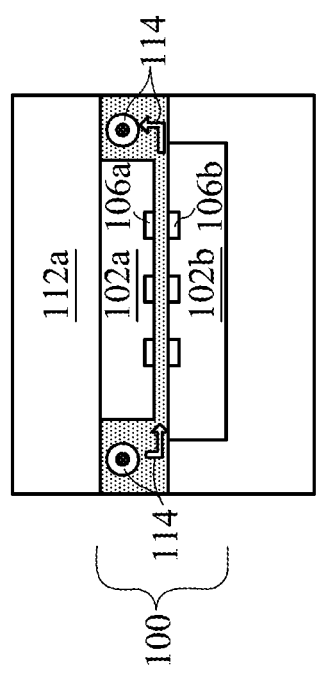
FIGS. 14 and 15 are cross-sectional views of portions of the electroless plating kit shown in FIG. 13 that illustrate a flow of a solvent in an electroless plating process in accordance with some embodiments.
Figure 15:
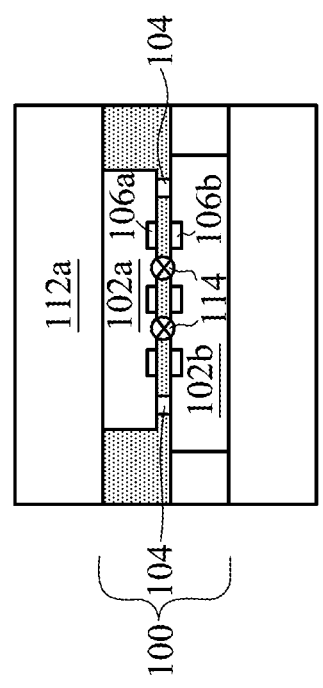

FIGS. 14 and 15 are cross-sectional views of portions of the electroless plating kit shown in FIG. 13 that illustrate a flow of a solvent 114 in an electroless plating process or immersion process shown in FIG. 13. The flow of the solvent 114 between the first semiconductor device 102a and the second semiconductor device 102b along an x axis in the view shown in FIG. 13 is shown in FIG. 14. The flow of the solvent 114 between the first semiconductor device 102a and the second semiconductor device 102b along a y axis in the view shown in FIG. 13 is shown in FIG. 15.

Figure 16:
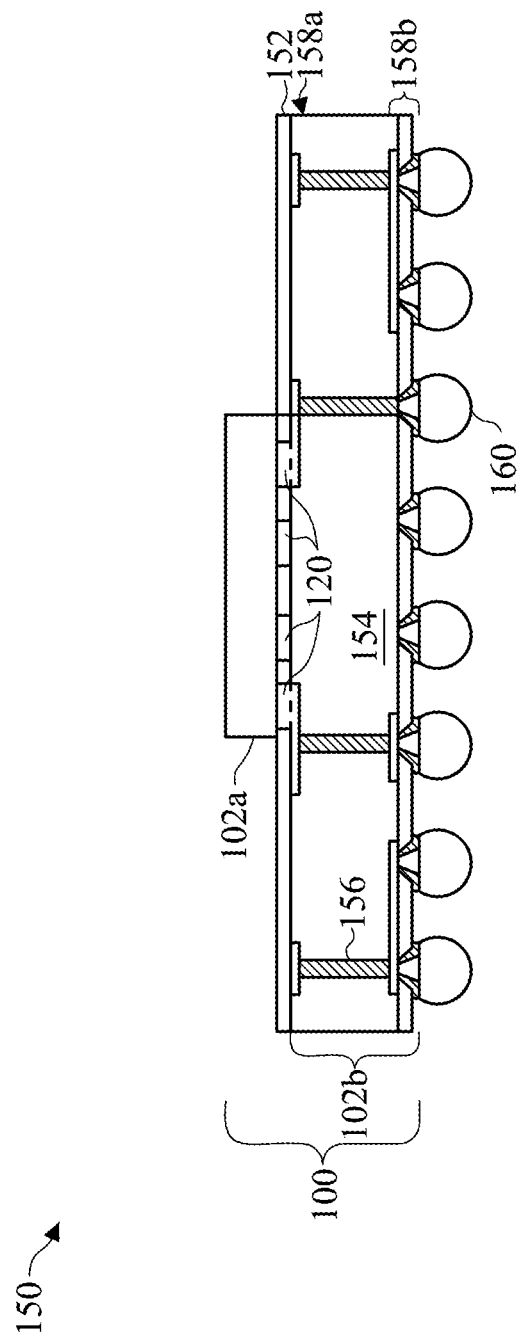
FIGS. 16 through 19 are cross-sectional views illustrating packaged semiconductor devices that include the immersion interconnections in accordance with some embodiments.
Figure 17:
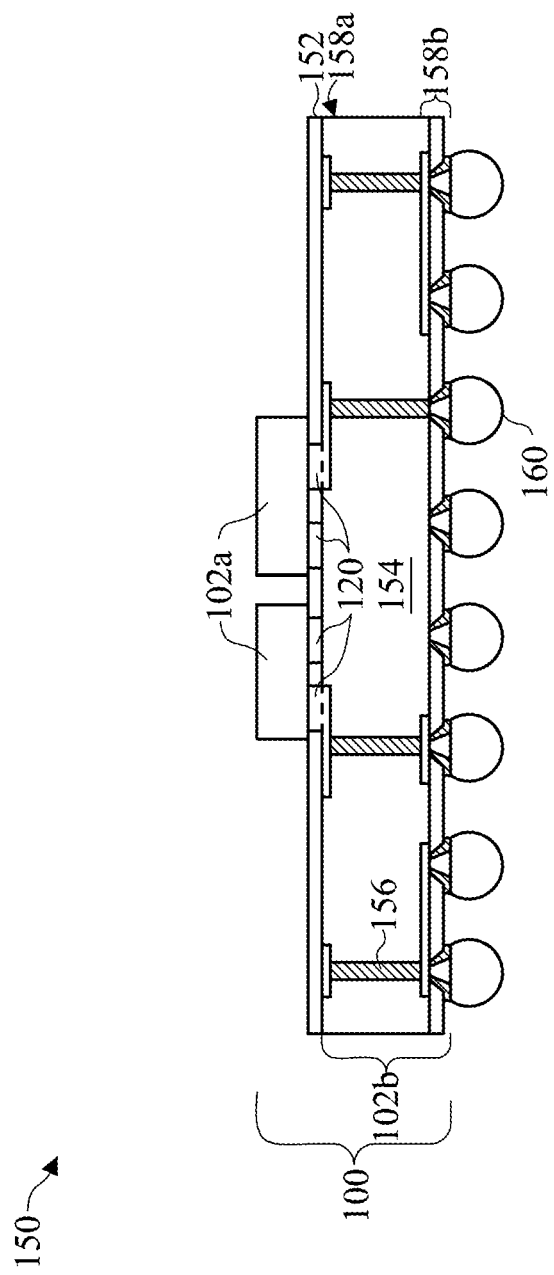
Figure 18:
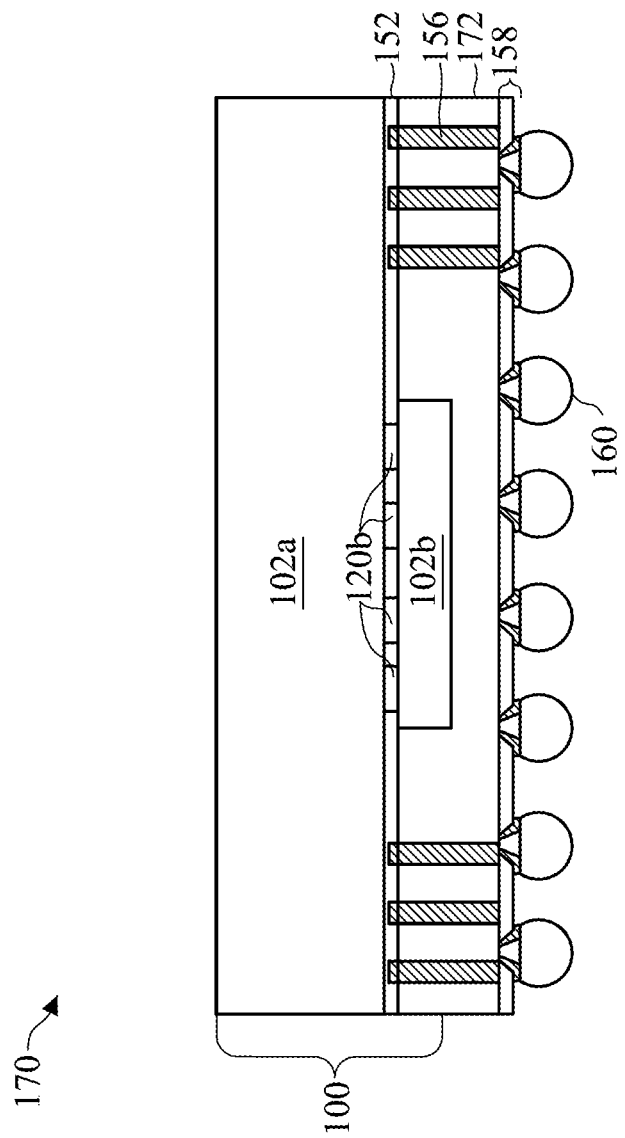
Figure 19:
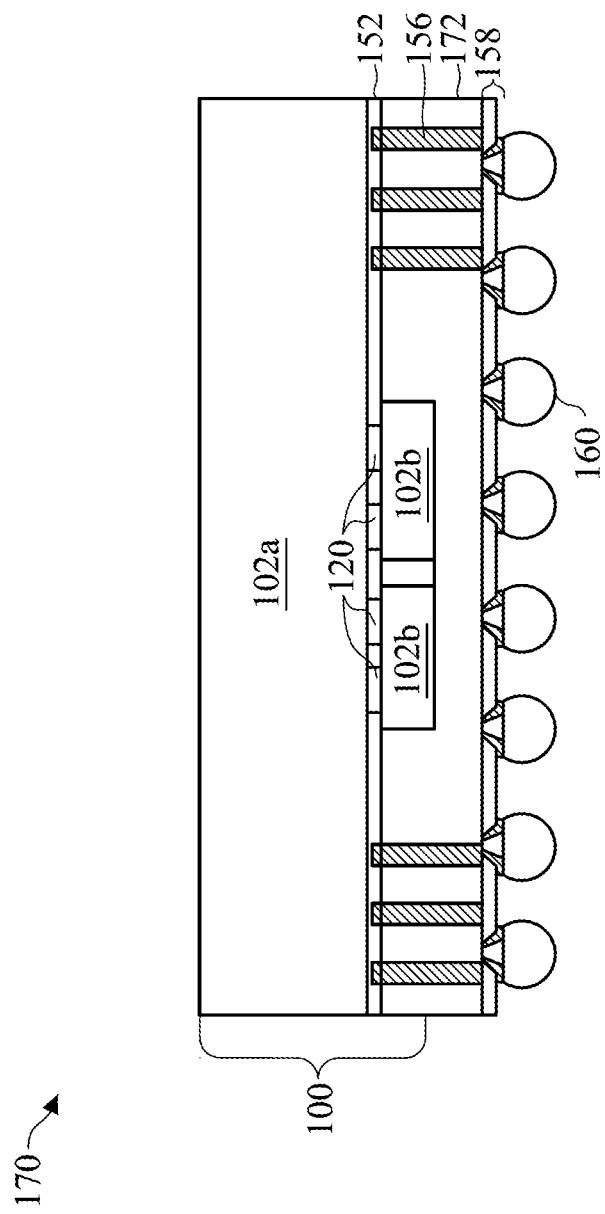

FIGS. 16 through 19 are cross-sectional views illustrating packaged semiconductor devices 150 and 170 that include the immersion interconnections. In FIGS. 16 and 17, packaged semiconductor devices 150 may include second semiconductor devices 102b that comprise interposer substrates, and the packaged semiconductor devices 150 that include semiconductor devices 100 described herein may comprise 3DICs or chip-on-wafer-on-substrate (CoWoS) devices. In FIGS. 18 and 19, packaged semiconductor devices 170 that include semiconductor devices 100 described herein may comprise three dimensional integrated fan-out (3D InFO) devices.

In FIG. 16, packaged semiconductor device 150 includes a first semiconductor device 102a comprising an integrated circuit die that is coupled to a second semiconductor device 102b by a plurality of immersion interconnections 120. The spacers 104 may be left remaining in the packaged semiconductor device 150, or the spacers 104 may be removed, as illustrated in FIG. 16. The second semiconductor device 102b comprises an interposer substrate 154 that includes a plurality of through-vias 156 formed therein. The plurality of through-vias 156 provides vertical electrical connections for the packaged semiconductor device 150 from one side (i.e., the top side) of the second semiconductor device 102b to the other side (i.e., the bottom side). The second semiconductor device 102b includes an interconnect structure 158a and 158b on each side that provide horizontal electrical connections for the packaged semiconductor device 150. The top interconnect structure 158a may include fan-out wiring comprised of one or more conductive line layers, for example. The top interconnect structure 158a may also include one or more conductive via layers, not shown. A plurality of connectors 160 that may comprise solder balls or bumps arranged in a ball grid array (BGA), controlled collapse chip connection (C4) bumps, or other types of connectors, may be coupled to the bottom interconnect structure 158b and used to electrically connect the packaged semiconductor device 150 to another device, board, or other device in an end application. The packaged semiconductor device 150 may be coupled to a substrate by the connectors 160 to form a CoWoS device, for example.

The connectors 160 may be coupled to the second semiconductor device 102b after, or before, the first semiconductor device 102a is coupled to the second semiconductor device 102b by the spacers 104 and after the immersion interconnections 120 are formed in some embodiments, for example.

An insulating material 152 may be disposed between the first semiconductor device 102a and the second semiconductor device 102b, e.g., between and around the immersion interconnections 120. The insulating material 152 may comprise an epoxy, polyimide, an underfill material, or other types of materials.

FIG. 17 illustrates a packaged semiconductor device 150 wherein the first semiconductor device 102a comprises two or more integrated circuit dies that are coupled to the second semiconductor device 102b comprising an interposer substrate 154 by a plurality of the immersion interconnections 120 described herein. The packaged semiconductor device 150 may be coupled to a substrate by the connectors 160 to form a CoWoS device, for example.

In accordance with some embodiments, a method of manufacturing a device includes coupling a first semiconductor device 102a to a second semiconductor device 102b by a plurality of spacers 104, the first semiconductor device 102a having a plurality of first contact pads 106b disposed thereon, the second semiconductor device 102b having a plurality of second contact pads 106b disposed thereon, the plurality of spacers 104 being spaced apart from the first contact pads 106a and the second contact pads 106b. The method includes using an electroless plating process to form an immersion interconnection 120 between each of the plurality of first contact pads 106a of the first semiconductor device 102a and one of the plurality of second contact pads 106b of the second semiconductor device 102b. In some embodiments, the second semiconductor device 102b is in wafer form as shown in FIG. 10, and the manufacturing method further comprises singulating the second semiconductor device 102b, e.g., along scribe lines 128.

In some embodiments, a manufacturing method comprises coupling a first semiconductor device 102a that comprises an integrated circuit die, and the second semiconductor device 102b comprises an interposer substrate 154 as shown in FIG. 16 or 17 comprising a plurality of through-vias 156 disposed therein, an interconnect structure 158b coupled to the interposer substrate 154 and the plurality of through-vias 156, and a plurality of connectors 160 coupled to the interconnect structure 158b.

Referring next to FIG. 18, in some embodiments, a manufacturing method comprises coupling a first semiconductor device 102a that comprises a first integrated circuit die, and the second semiconductor device 102b comprises a second integrated circuit die. The method further comprises forming a molding material 172 around the second integrated circuit die, forming a plurality of through-vias 156 in the molding material 172, and coupling an interconnect structure 158 to the molding material 172, the plurality of through-vias 156, and the second integrated circuit die. A plurality of connectors 160 may be coupled to the interconnect structure 158. The interconnect structure 158 may comprise fan-out wiring for the packaged semiconductor device 170. The packaged semiconductor device 170 may comprise a 3D InFO device in some embodiments.

In some embodiments, a manufacturing method comprises providing a second semiconductor device 102b that comprises a plurality of the second integrated circuit dies as shown in FIG. 19, and the method comprises forming the molding material 172 around the plurality of second integrated circuit dies. The packaged semiconductor device 170 may comprise a 3D InFO device in some embodiments.

In some of the embodiments shown in FIGS. 18 and 19, the second semiconductor device 102b may first be coupled to the first semiconductor device 102a by the spacers 104 and the immersion interconnections 120 may be formed, followed by the formation of the insulating material 152, the plurality of through-vias 156, the molding material 172, the interconnect structure 158, and the connectors 160. One or more carriers may be used to encapsulate the second semiconductor device 102b with the molding material 172 and form other features of the packaged semiconductor device 170, such as the through-vias 156, insulating material 152, interconnect structure 158, and connectors 160. In some embodiments, the second semiconductor device 102b may be encapsulated with the molding material 172 and other features of the packaged semiconductor device 170 such as the through-vias 156, insulating material 152, interconnect structure 158, and connectors 160, may be formed before the first semiconductor device 102a is coupled to the second semiconductor device 102b by the spacers 104 and before the immersion interconnections 120 are formed.

Figure 20:
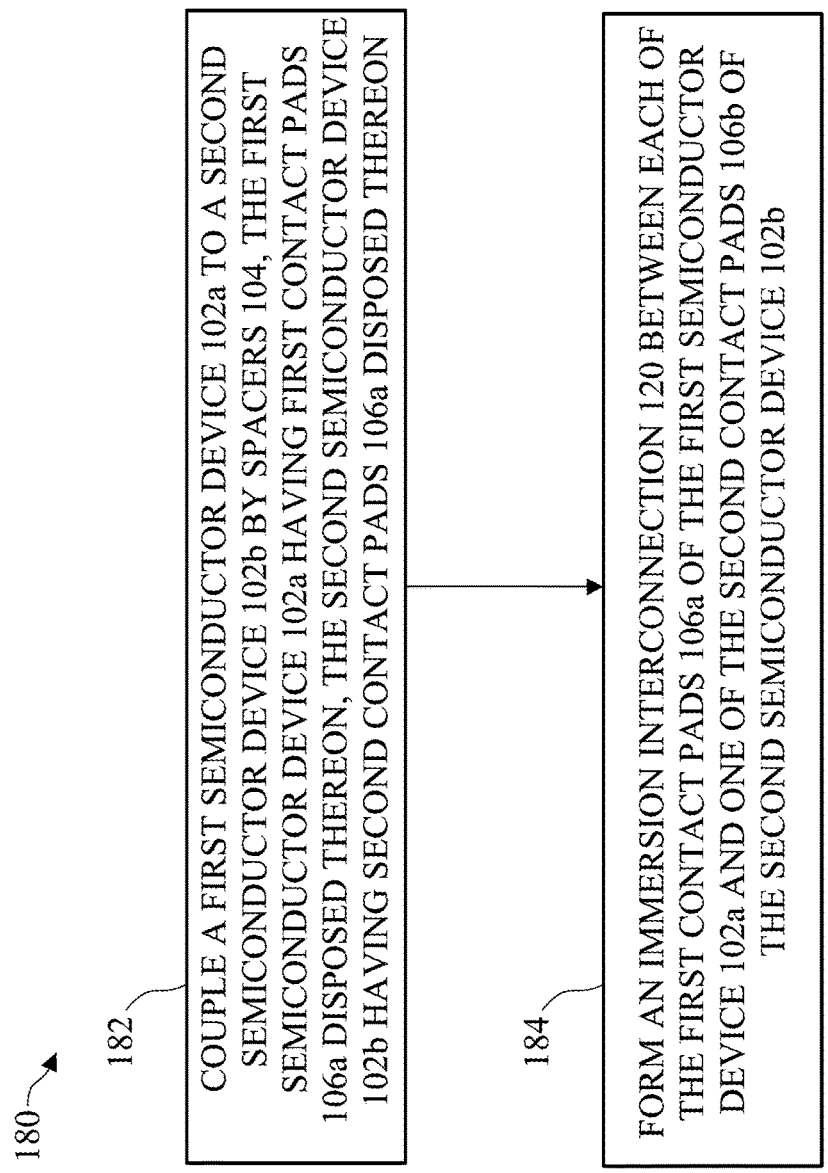
FIG. 20 is a flow chart that illustrates a manufacturing method for a semiconductor device in accordance with some embodiments of the present disclosure.

FIG. 20 is a flow chart 180 that illustrates a method of manufacturing a semiconductor device 100 in accordance with some embodiments of the present disclosure. In step 182 of the flow chart 180, a first semiconductor device 102a is coupled to a second semiconductor device 102b by a plurality of spacers 104, the first semiconductor device 102a having a plurality of first contact pads 106a disposed thereon, and the second semiconductor device 102b having a plurality of second contact pads 106b disposed thereon (see also FIG. 1). In step 184, an immersion interconnection 120 is formed between each of the plurality of first contact pads 106a of the first semiconductor device 102a and one of the plurality of second contact pads 106b of the second semiconductor device 102b (see also FIGS. 2 and 3).

Some embodiments of the present disclosure include semiconductor devices 100 that include spacers 104 and immersion interconnections 120 between contact pads 106a and 106b, as described herein. Some embodiments include semiconductor devices 100 that include immersion interconnections 120 between contact pads 106a and 106b, wherein the spacers 104 have been removed. Some embodiments of the present disclosure include methods of manufacturing the semiconductor devices 100 that include the immersion interconnections 120 using the spacers 104 and immersion processes described herein.

Some advantages of some embodiments of the present disclosure include providing semiconductor devices and 3DICs with solderless immersion interconnections between contact pads of integrated circuit dies. Post-stacking interconnection processes and structures are provided that are particularly advantageous when used in high density chip stacking in 3D packaging applications, for example. Pre-aligned die stacking and post-stacking electroless plating processes are used to form joints comprising immersion interconnections. Combined with chip-on-wafer (CoW) processes, the immersion processes described herein may enable known-good-dies (KGDs) with better yields, and heterogeneous devices chips can be stacked in one package, in some embodiments.

The immersion interconnections comprise a simplified process flow and interconnection structure between two semiconductor devices such as integrated circuit dies, and may have a short cycle time in some embodiments, resulting in a cost savings. The immersion process used to form the immersion interconnections may advantageously be performed at low temperatures without requiring a bonding force or thermal mechanical force, resulting in improved yields. Process windows of coplanarity and alignment are enhanced by the use of the immersion process and electroless plating. For example, the immersion process used to form the immersion interconnections comprises a selective deposition process, so that contact pads and/or conductive pillars that may be slightly mis-aligned will still be connected with the immersion interconnections formed. Some embodiments of the present disclosure described herein may be implemented in wafer-to-wafer, chip-to-chip, and chip-to-wafer bonding. Furthermore, the methods and devices described herein are easily implementable into existing semiconductor device manufacturing and/or packaging process flows and structures.

In some embodiments, a method of manufacturing a device includes coupling a first semiconductor device to a second semiconductor device by a plurality of spacers. The first semiconductor device has a plurality of first contact pads disposed thereon and the second semiconductor device has a plurality of second contact pads disposed thereon. An immersion interconnection is formed between each of the plurality of first contact pads of the first semiconductor device and one of the plurality of second contact pads of the second semiconductor device.

In some embodiments, a method of manufacturing a device includes coupling a first semiconductor device to a second semiconductor device by a plurality of spacers, the first semiconductor device having a plurality of first contact pads disposed thereon and the second semiconductor device having a plurality of second contact pads disposed thereon. The plurality of spacers is spaced apart from the first contact pads and the second contact pads. The method includes using an electroless plating process to form an immersion interconnection between each of the plurality of first contact pads of the first semiconductor device and one of the plurality of second contact pads of the second semiconductor device.

In some embodiments, a semiconductor device includes a first integrated circuit die having a plurality of first contact pads disposed thereon and a second integrated circuit die having a plurality of second contact pads disposed thereon coupled to the first integrated circuit die. A plurality of spacers is coupled to the first integrated circuit die and the second integrated circuit die. The plurality of spacers is disposed between the first integrated circuit die and the second integrated circuit die proximate the plurality of first contact pads and the plurality of second contact pads. The plurality of spacers is spaced apart from the first contact pads and the second contact pads. An immersion interconnection is disposed between each of the plurality of first contact pads and one of the plurality of second contact pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device, the method comprising:
   coupling a first semiconductor device to a second semiconductor device by a plurality of non-conductive spacers, the first semiconductor device having a plurality of first contact pads disposed thereon, the second semiconductor device having a plurality of second contact pads disposed thereon, the plurality of non-conductive spacers being spaced apart from the first contact pads and the second contact pads, the plurality of first contact pads being electrically isolated from the plurality of second contact pads after coupling the first semiconductor device to the second semiconductor device; and
   thereafter, forming an immersion interconnection between one of the plurality of first contact pads of the first semiconductor device and a corresponding one of the plurality of second contact pads of the second semiconductor device by plating a conductive material extending from a surface of the plurality of first contact pads facing the second semiconductor device and further extending from a surface of the plurality of second contact pads facing the first semiconductor device while the first semiconductor device and the second semiconductor device are at least partially submerged in a solvent.

2. The method according to claim 1, wherein coupling the first semiconductor device to the second semiconductor device comprises coupling a first semiconductor device comprising a wafer, an integrated circuit die, or a plurality of integrated circuit dies to the second semiconductor device.

3. The method according to claim 1, wherein coupling the first semiconductor device to the second semiconductor device comprises coupling the first semiconductor device to a second semiconductor device comprising a wafer, an integrated circuit die, or a plurality of integrated circuit dies.

4. The method according to claim 1, further comprising removing the plurality of non-conductive spacers.

5. The method according to claim 1, wherein the plurality of non-conductive spacers is disposed on proximate edges or a perimeter of the first semiconductor device or the second semiconductor device.

6. The method according to claim 1, wherein coupling the first semiconductor device to the second semiconductor device comprises forming a three-dimensional integrated circuit (3DIC) device.

7. A method of manufacturing a device, the method comprising:
   coupling a first semiconductor device to a second semiconductor device by a plurality of non-conductive spacers, the first semiconductor device having a plurality of first contact pads disposed thereon, the second semiconductor device having a plurality of second contact pads disposed thereon, the plurality of non-conductive spacers being spaced apart from the first contact pads and the second contact pads, and the plurality of first contact pads being electrically isolated from the plurality of second contact pads after coupling the first semiconductor device to the second semiconductor device; and
   thereafter, using an electroless plating process to form an immersion interconnection between one of the plurality of first contact pads of the first semiconductor device and a corresponding one of the plurality of second contact pads of the second semiconductor device, wherein the immersion interconnection is formed by plating a conductive material extending from a surface of the plurality of first contact pads facing the second semiconductor device and further extending from a surface of the plurality of second contact pads facing the first semiconductor device while the first semiconductor device and the second semiconductor device are at least partially submerged in a solvent.

8. The method according to claim 7, wherein the second semiconductor device is in wafer form, and wherein the method further comprises singulating the second semiconductor device.

9. The method according to claim 7, wherein coupling the first semiconductor device comprises coupling a first integrated circuit die, wherein the second semiconductor device comprises a second integrated circuit die, and wherein the method further comprises: forming a molding material around the second integrated circuit die; forming a plurality of through-vias in the molding material; coupling an interconnect structure to the molding material, the plurality of through-vias, and the second integrated circuit die; and coupling a plurality of connectors to the interconnect structure.

10. The method according to claim 9, wherein the interconnect structure comprises fan-out wiring.

11. The method according to claim 9, wherein the second semiconductor device comprises a plurality of the second integrated circuit dies, and wherein the method comprises forming the molding material around the plurality of second integrated circuit dies.

12. The method according to claim 7, further comprising packaging the first semiconductor device and the second semiconductor device to form a chip-on-wafer-on-substrate (CoWoS) device or a three dimensional integrated fan-out (3D InFO) device.

13. A method of manufacturing a device, the method comprising:
  coupling a first semiconductor device to a second semiconductor device by a plurality of non-conductive spacers, the first semiconductor device having a plurality of first contact pads disposed thereon, the second semiconductor device having a plurality of second contact pads disposed thereon and electrically isolated from the plurality of first contact pads across a gap between the coupled first and second semiconductor devices, the plurality of non-conductive spacers being spaced apart from the first contact pads and the second contact pads; and
  forming a conductive immersion interconnection between one of the plurality of first contact pads of the first semiconductor device and a corresponding one of the plurality of second contact pads of the second semiconductor device through an action of a solvent flow in the gap upon a surface of the one of the plurality of first contacts pads of the first semiconductor device and upon a surface of the corresponding one of the plurality of second contact pads of the semiconductor device, wherein the solvent comprises a conductive material.

14. The method according to claim 13, wherein coupling the first semiconductor device to the second semiconductor device comprises coupling a first semiconductor device comprising a wafer, an integrated circuit die, or a plurality of integrated circuit dies to the second semiconductor device.

15. The method according to claim 13, wherein coupling the first semiconductor device to the second semiconductor device comprises coupling the first semiconductor device to a second semiconductor device comprising a wafer, an integrated circuit die, or a plurality of integrated circuit dies.

16. The method according to claim 13, wherein the action of the solvent flow comprises plating a conductive material extending from a surface of the plurality of first contact pads facing the second semiconductor device and further extending from a surface of the plurality of second contact pads facing the first semiconductor device while the first semiconductor device and the second semiconductor device are at least partially submerged in a solvent.

17. The method according to claim 13, further comprising removing the plurality of non-conductive spacers.

18. The method according to claim 13, wherein the plurality of non-conductive spacers is disposed on proximate edges or a perimeter of the first semiconductor device or the second semiconductor device.

19. The method according to claim 13, wherein coupling the first semiconductor device to the second semiconductor device comprises forming a three-dimensional integrated circuit (3DIC) device.

20. The method according to claim 13, wherein the conductive material comprises Cu, Ni, Pd, Au, Co, Ag, Sn, Pb, Rh, Fe, and/or combinations thereof.

* * * * *